United States Patent [19]

Meyers et al.

[11] Patent Number: 5,794,008

[45] Date of Patent: Aug. 11, 1998

[54] ELECTRICAL NETWORK MODELING TOOL AND ANALYZER

[75] Inventors: Clifford W. Meyers, Rancho Palos Verdes; John K. Doughty, Redondo Beach, both of Calif.

[73] Assignee: Raytheon Company, Lexington, Mass.

[21] Appl. No.: 608,346

[22] Filed: Feb. 28, 1996

[51] Int. Cl.$^6$ ............................................. G06F 11/00
[52] U.S. Cl. ................................................ 395/500
[58] Field of Search ........................... 395/500; 364/578, 364/488–491, 481–485, 554

[56] References Cited

U.S. PATENT DOCUMENTS

| | | | |
|---|---|---|---|
| 5,072,189 | 12/1991 | Openlander | 324/638 |
| 5,307,284 | 4/1994 | Brunfeldt et al. | 364/485 |
| 5,467,291 | 11/1995 | Fan et al. | 364/578 |
| 5,578,932 | 11/1996 | Adamian | 324/601 |
| 5,598,348 | 1/1997 | Rusu et al. | 364/491 |

*Primary Examiner*—Kevin J. Teska
*Assistant Examiner*—Ayni Mohamed
*Attorney, Agent, or Firm*—Leonard A. Alkov; Glenn H. Lenzen, Jr.

[57] ABSTRACT

A low cost electrical network analyzer that provides waveform predictions in the time domain of a device for any electrical signal stimuli and with any load. In a preferred embodiment, input, output and stimulating source waveform recorders are used to record tables of time domain data (voltage waveforms) derived by stimulating the device under test with and without an output load coupled thereto. The tables of time domain data are representative of input and output signatures of the device. The tables are stored in a processor and are processed by way of a computer-implemented time domain network analyzer to produce sets of complex parameters as a function of time that are representative of the device. The parameters thus comprise a model of the analyzed device. The computer-implemented analyzer includes a data acquisition and emulator device (or software) that embodies mathematical equations describing particular electrical networks and that computes or measures input and output voltage waveforms of the device. The input and output voltage waveforms are stored in input tables and are subsequently used to calculate electrical parameters of the device. A modeling means (or software) is used to process the input and output voltage waveforms using discrete LaPlace transforms and for calculating the electrical network parameters of the device. A prediction means (or software) is used to evaluate how the device responds to input signals applied thereto. The prediction means computes transfer functions (voltage versus time graphs or tabular listings) for the device using the electrical network parameters and user defined input and output impedance values of the device. In addition, the prediction means translates data contained in the transfer functions into the frequency domain to provide amplitude and phase data versus time for the device. A display is coupled to the prediction means for displaying the voltage versus time graphs or tabular listings and amplitude and phase versus time data of the device.

8 Claims, 3 Drawing Sheets

ELECTRICAL NETWORK MODELING TOOL AND ANALYZER

BACKGROUND

1. Field of the Invention

The present invention relates to an apparatus for analyzing electrical networks or devices, and more specifically to a time domain network analyzer for deriving parameters of a network model from measured signals that may be used to predict both the frequency and time domain response of a device under test.

2. Description of the Related Art

Typical prior art devices and techniques for analyzing electrical networks use a complex multi-channel receiver, graphic display, and a wide frequency range signal source, which is often synthesized. The accuracy of such devices is derived from the use of precision components and internal automated calibrations. Measurements of one and two port devices under test include gain and phase transfer functions, impedances, and S-parameters.

The most common method is to stimulate a device under test with a swept frequency source. Voltages and currents at each port are received and measured for amplitude and phase by downconversion using analogue or digitized methods. The data is internally converted to forms more easily displayed and recognized. In network analyzers such as HP3577 and HP4195 network analyzers, gain and phase transfer functions of the device under test are plotted as a function of frequency. With an additional impedance test kit, the HP4195 network analyzer can measure complex impedances for plotting on a Smith chart (over the frequency tested). By adding a test set to the HP4195 network analyzer to provide switching, couplers, splitters and loads, the instrument can characterize the in-circuit performance of the device under test as S-parameters.

Instruments such as an HP3562 low frequency signal analyzer not only have similar swept sine network capability, but also have storage scope capabilities to permit waveform capture of a device under test. Displays of both time and frequency domain results are possible by use of internal linear FFT processing. Sophisticated math packs in the HP8510 high frequency network analyzer even reverse the transform to convert the amplitude/phase measurements across frequency into a time domain display similar to that which a time domain reflectometer would supply.

Prior art low frequency circuit testing and performance analysis has been accomplished by parametric testing. This traditionally requires a large number of independent tests to be run on complex test equipment. To test a typical low frequency circuit or network requires that the network be stimulated with an input waveform containing a broad spectrum of frequencies.

There are several disadvantages to the prior art devices. The prior art devices do not supply the full versatility and capability of the present invention. Prior art electrical network analyzers are limited to only measuring the performance of the device under test for a specified set of test conditions existing during the actual measurement. Although some prior art devices provide mathematical modeling of the device under test, the modeling is accomplished by selecting component values for a select few pre-specified network models. This is only useful for characterizing singular components, such as inductors with winding resistance and stray capacitance.

Recent market requirements for network analyzers for both factory and field testers show that they need to be reduced in size for greater portability. Salient features of such desired equipment includes reduction of skill level and cost of testing low frequency electrical networks and equipment fault diagnosis using functional testing techniques at reduced cost. Furthermore, no prior art devices provide waveform predictions in the time domain.

Consequently, it would greatly benefit the art to have an electrical network analyzer that provides waveform predictions in the time domain for various applications discussed below, and for providing total circuit characterization without the need for additional hardware.

SUMMARY OF THE INVENTION

To meet the above and other objectives, the present invention seeks to overcome deficiencies in the prior art by providing a low cost electrical network analyzer that provides waveform predictions in the time domain of a device or network for any electrical signal stimuli and with any load. The present invention is a virtual electrical network analyzer for analyzing electrical network characteristics of a device under test. Three channels (input, output and stimulating source) of waveform recorders are respectively coupled to the input and output of a device that is to be analyzed, and to an output of the stimulating source. The waveform recorders are used to record tables of time domain data (voltage waveforms) derived by stimulating the device under test with and without an output load coupled thereto. The tables of time domain data are representative of input and output signatures of the device under test. These tables are stored in a processor and are processed by way of a computer-implemented time domain network analyzer engine implemented in the processor to produce sets of complex parameters as a function of time that are representative of the device. The parameters thus comprise a model of the analyzed device.

The computer-implemented time domain network analyzer engine includes a data acquisition and emulator means (or software) that acquires, stores and emulates input and output voltage waveforms of the device. The input and output voltage waveforms are stored in input tables and are subsequently used to calculate electrical network parameters of the device. A modeling means (or software) is coupled to the data acquisition and emulator means for processing the input and output voltage waveforms using discrete LaPlace transforms and for calculating the complex electrical network parameters of the device (input impedance, output impedance, transconductance, and gain). A prediction means (or software) is coupled to the data acquisition and emulator means and modeling means for evaluating how the device responds to input signals applied to the device. The prediction means computes a transfer function for the device using the previously computed electrical network parameters and user defined input and output impedance values of the device. This mathematical transfer function can then be used to predict the time domain behavior of the network with respect to any input stimuli (voltage versus time graphs or tabular listings). In addition, the prediction means translates data contained in the transfer functions into the frequency domain to provide amplitude and phase data versus time for the device. A display is coupled to the prediction means for displaying the voltage versus time graphs or tabular listings and amplitude and phase versus time data of the device.

The present invention trades hardware complexity for software sophistication. It uses the mathematical relationship that characterize the transient response of the device, LaPlace transforms, and circuit analysis techniques to derive a predictive model of a 2 port analog device. That is, a discrete LaPlace transform model is derived for the 2-port device under test. This model is derived by making voltage measurements of a source waveform, which is the waveform applied to input terminals of the device under test and the waveform at the output terminals of the device under test. Sampled waveforms are converted to a discrete LaPlace transform, and then using network analysis, are converted to network parameters of the device. The calculated network parameters (input impedance, output impedance, transconductance, and gain) represent the performance and linear characteristics of the device under test. Furthermore, these network parameters may be used to predict the time domain response of the device to a wide variety of inputs.

The present invention reduces the skill level and cost of testing low frequency electrical networks. The present invention provides waveform predictions in the time domain for any stimuli applied to and with any load on a device under test. The present invention may be used to provide high speed, low cost, functional test for low frequency analog modules for military ground support equipment for the organizational, intermediate and depot level. The present invention may be used to provide low cost network analysis coupled with histograms to characterize module tolerances in manufacture for factory test equipment used to screen defective items. The present invention may be used to simplify incoming inspection test while reducing the skill level required for testing. The present invention may be used to provide a low cost tool to assist the electrical circuit designed in characterizing network performance to reduce design costs by permitting network parameters to be precisely adjusted to meet specified performance objectives. The present invention may be used to provide a low cost laboratory tool for colleges and technical schools for use in research and classroom to demonstrate electrical network performances.

None of the prior art instruments described in the Background section have the capability and versatility that the present invention offers, nor do they have the potential for low instrument cost and simplicity. Prior art network analyzers are limited in that they only measure the performance of the device under test for a given set of test conditions existing during the measurement. Some of these instruments provide modeling of the device under test but the modeling is accomplished by selecting component values for a select few predefined models. This is most useful only for characterizing singular components, such as inductors with winding resistance and stray capacitance. The present invention provides a general purpose model that completely characterizes the device under test. It may be used for acceptance tests or to predict the performance of the device under test at either port, under any load conditions and/or stimulus. Using the appropriate network mathematics and discrete LaPlace transforms, the present invention can generate gain and phase transfer plots as a function frequency without specialized swept frequency equipment, thus simplifying the instrument and reducing its cost and the cost of device testing and characterization.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

The following description is provided to enable any person skilled in the art to which the present invention pertains, or with which it is most nearly connected, to make and use the same, and sets forth the best mode contemplated by the inventors for carrying out their invention. Various modifications, however, will remain readily apparent to those skilled in the art since the generic principals of the present invention have been defined herein specifically to practice an electrical network analyzer 30 (described with reference to FIGS. 3 and 4) in accordance with the principles of the present invention.

Figure 1:
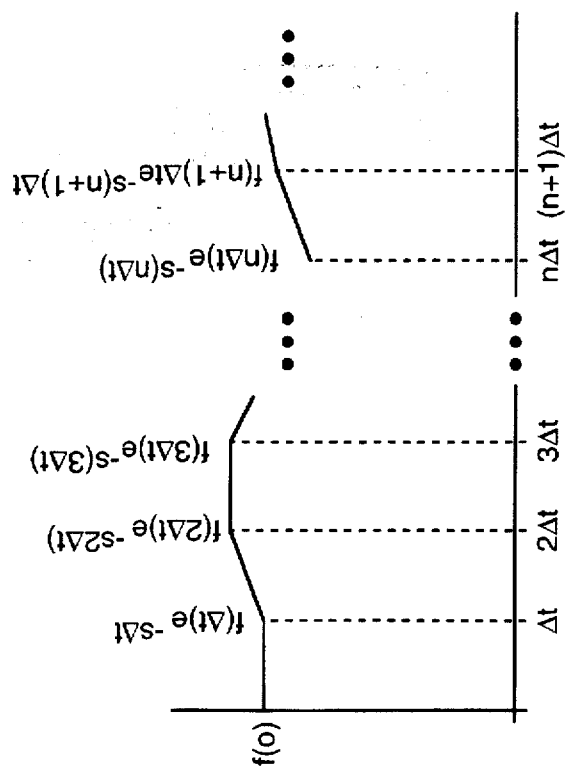
FIG. 1 is a graphical representation of a continuous LaPlace transform upon which the present invention is derived.

The present invention is based upon the use of a discrete LaPlace transform, this approach was taken because Z-transforms were found to be incompatible with the new process. Furthermore, since the new process was discrete in nature, conventional LaPlace transforms were not suitable. Therefore, a discrete LaPlace transform was developed. This concept is derived from a continuous LaPlace transform. Referring to the drawing figures, FIG. 1 is a graphical representation of a continuous LaPlace transform upon which the present invention is derived. For a continuous time function f(t) the continuous LaPlace transform F(s) is defined by the equation $$F(S) = \int_0^\infty f(t)e^{-st}dt$$

If f*(t) represents a discrete function, a different approach for calculating F*(S) is employed. Assume that f*(t) represents a discretely sampled continuous function f(t), where $\Delta t$ is the sampled interval. FIG. 1 shows a graphical representation of the multiplication of $f(n\Delta t)e^{-sn\Delta t}$. To obtain the discrete LaPlace transform, F*(S) of f*(n$\Delta$t) requires that the function, represented in FIG. 1, be integrated. The trapezoidal rule is a method of numerical integration that can be used, as follows:

$$A_0 = [f_0 + f(\Delta t)e^{-s\Delta t}](\Delta t)/2$$

$$A_1 = [f(\Delta t)e^{-s\Delta t} + f(2\Delta t)e^{-s(2\Delta t)}](\Delta t)/2$$

.
.
.

$$A_{N-1} = [f([N-1]\Delta t)e^{-s(N-1)\Delta t} + f(N\Delta t)e^{-sN\Delta t}](\Delta t)/2,$$

where N=Nth, or last, sampled data point.

The total area under the curve is represented as:

$$Area = \sum_{n=0}^{N-1} A_n$$

-continued $$\text{Area} = f(0)(\Delta t)/2 + f(N\Delta t)e^{-sN\Delta t}(\Delta t)/2 + \sum_{n=0}^{N-1} f(n\Delta t)e^{-sn\Delta t}(\Delta t).$$

Therefore, the above equation represents the discrete LaPlace transform of f*(t). Furthermore, this method provides a procedure for determining the discrete LaPlace transform of any waveform. This is important when one considers that real world waveforms may be difficult to represent mathematically in a closed form solution. However, all waveforms can be represented as a table of values with respect to time.

The relationship between the continuous LaPlace transform and the discrete LaPlace transform is shown by obtaining the discrete LaPlace transform F*(S) for f(t)=U(t) (simple step function).

$$F^*(S) = (\Delta t)/2 + \sum_{n=0}^{\infty} e^{-sn\Delta t}(\Delta t) = (1 + e^{-s\Delta t})(\Delta t)/2(1 + e^{-s\Delta t}).$$

If F*(S) is related to F(S), then F*(S) should converge to F(S) as $\Delta t$ approaches zero. That is, as $\Delta t$ approaches zero, F*(S) should become a continuous function.

$$\lim F^*(S)_{\Delta t \to 0} = (1+e^{-s\Delta t})(\Delta t)/2Se^{-s\Delta t}|\Delta t \to 0.$$

Using convergence theory:

$$\lim F^*(S)_{\Delta t \to 0} = \{(1+e^{-s\Delta t})(\Delta t)+(-e^{-s\Delta t})(\Delta t)\}/2(s+e^{-s\Delta t}) |\Delta t \to 0.$$

$$\lim F^*(S) = 2/2s = 1/s = f(s).$$

Therefore, F*(S) and F(S) are related, and F*(S) is a true discrete LaPlace transform.

An analog network can be represented by four independent parameters (input impedance, output impedance, transconductance, and gain). The task is how to accurately measure each of these parameters. Traditionally, network analyzers have solved this problem using various techniques in the frequency domain. The present invention measures these parameters in the time domain.

Figure 2:
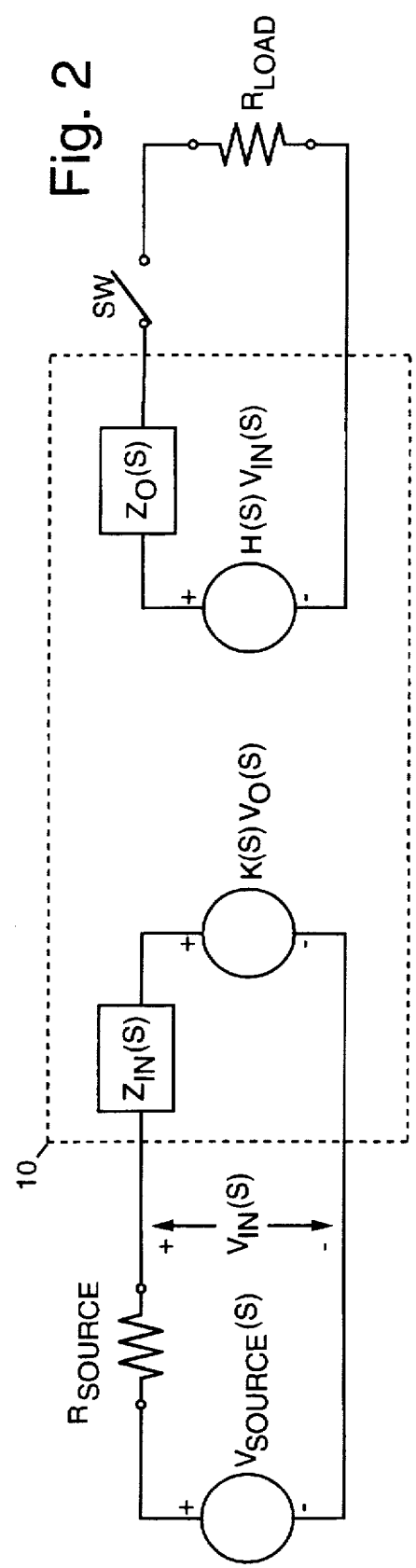
FIG. 2 illustrates a network model used to make measurements of network parameters of a device using the present invention.

FIG. 2 represents a network configuration required to make proper measurements of the network parameters. In FIG. 2, an electrical network 10 has unknown characteristics of which the present invention is intended to identify and quantify with conventional electronic circuit parameters. The electrical network 10 comprises a device under test 10 having two ports. A switch (SW) is used to set either a loaded or unloaded condition for the device 10. $R_{source}$ and $R_{load}$ are resistances selected by a user to provide proper loading and balance of the device 10. $V_{source}(S)$ is the required source to stimulate the device 10 and provides a reference signal. With this established, the following formulas may be used in the present network analyzer 30 to calculate the various network parameters. The first parameter is $$H(S) = V_o(S)_u/V_{in}(S)_u,$$

where:

$V_o(S)_u$ is the LaPlace transform of the unloaded output voltage.

$V_{in}(S)_u$ is the LaPlace transform of the unloaded input voltage.

The second parameter is $$Z_{in}(S) = \frac{R_{source}V_{in}(S)_u}{V_{source}(S)_u - V_{in}(S)_u},$$

where:

$R_{source}$ is the series source resistance $V_{source}(S)_u$ is the LaPlace transform of the unloaded source voltage.

The third parameter is $$Z_o(S) = \left( \left[ \frac{V_o(S)_u V_{in}(S)_L}{V_{in}(S)_u V_o(S)_L} \right] - 1 \right) R_{load},$$

where:

$V_{in}(S)_L$ = loaded input voltage
$V_o(S)_L$ = loaded output voltage.

The fourth parameter is $$K(S) = Z_{in}(S) = \frac{R_{load}[R_{source}(S)_u V_{in}(S)_L - V_{source}(S)_L V_{in}(S)_u]}{V_o(S)_L(V_{source}(S)_u - V_{in}(S)_u)},$$

where:

$V_{source}(S)_L$ is the LaPlace transform of the loaded source voltage.

A user measures the loaded and loaded voltage using the present network analyzer 30. The discrete measured waveforms are transformed into discrete LaPlace transform representations and are then used to calculate the above network parameters. These parameters represent the characteristics of the device under test 10.

Figure 3:
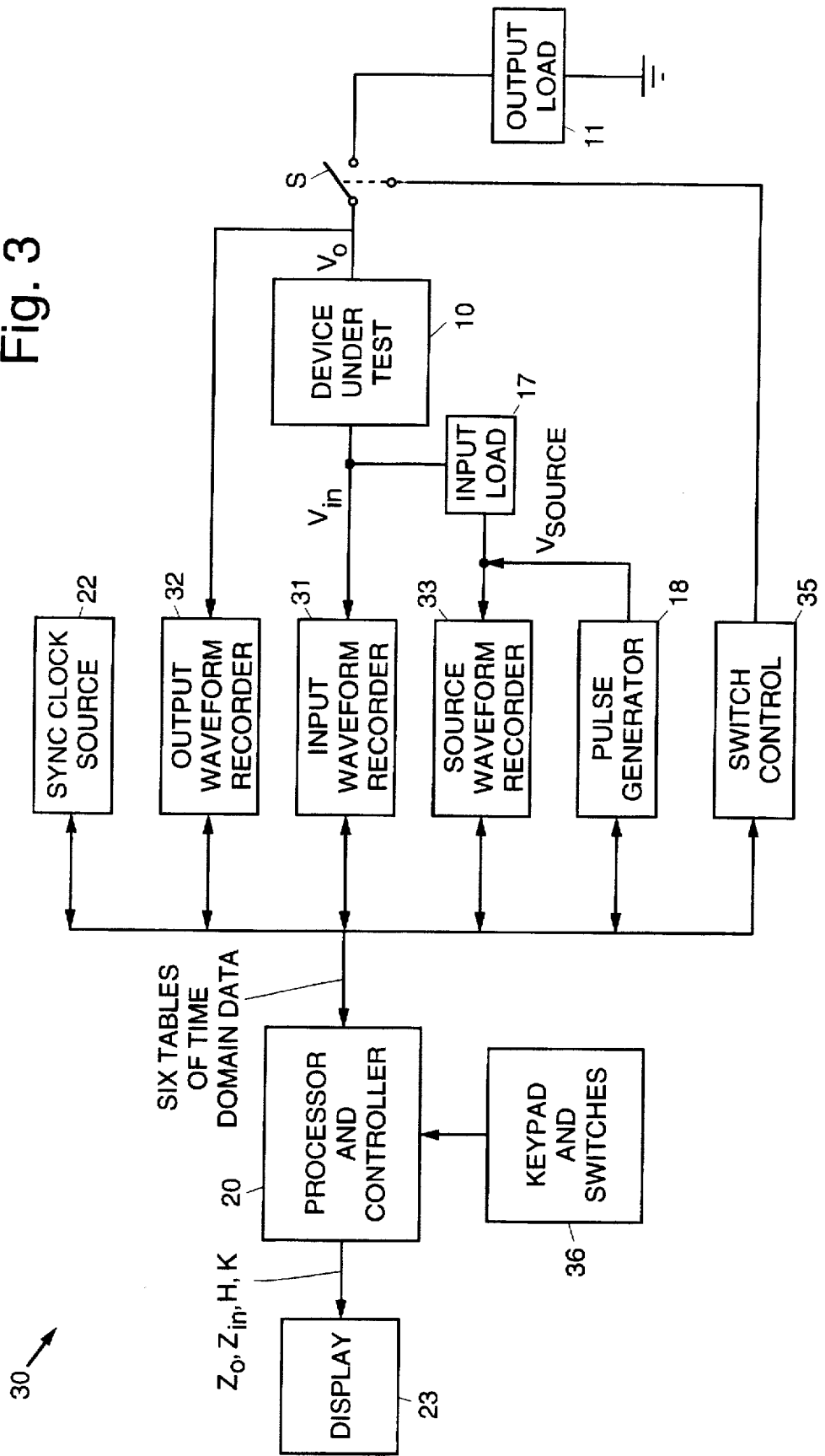
FIG. 3 illustrates an embodiment of the present invention showing hardware necessary to acquire input and output waveforms of the device under test.

FIG. 3 illustrates an embodiment of the present network analyzer 30 showing hardware necessary to acquire input and output waveforms of the device under test 10. The network analyzer 30 is shown as comprising input, output and source waveform recorders 31, 32, 33, input and output loads 17, 11, a pulse generator 18, a switch control circuit 35, a processor and controller 20 that includes a keypad and switches 36 and a display 23, and a sync clock source 22 for synchronizing data acquisition and transfer, interconnected as shown.

In operation, an input stimulus (input voltage waveform, typically a square wave signal) is generated by the pulse generator 18 and applied to the device under test 10, which has unknown network characteristics through the input load 17. The input stimulus is measured and recorded by the source waveform recorder 33. The pulse generator 18 is connected in series with the input load 17 and applies the input stimulus to the input of the device under test 10. The loaded input stimulus $V_{in}$ is also measured and recorded by the input waveform recorder 31. The output voltage $V_{out}$ from the device under test 10 is coupled to the output waveform recorder 32 which measures and records this voltage waveform. The switch control circuit 39 is controlled by a high speed processor and controller 20 to activate and deactivate the switch (SW) to selectively couple the output load 11 to the device under test 10. The high speed processor and controller 20 operates in conjunction with the sync clock source 22 to coordinate the operations of applying the input stimulus to the device under test 10, coupling the loads 11, 17 to the device under test 10, and recording the various loaded and unloaded voltage waveforms using the waveform generators 31-33. The user provides commands to the high speed processor and controller 20 through the keypad and switches 36 to operate the analyzer 30. The display 23 is connected to the high speed processor and controller 20, and is used to display analyzed results (models, waveforms, etc.) derived from the device under test 10.

Figure 4:
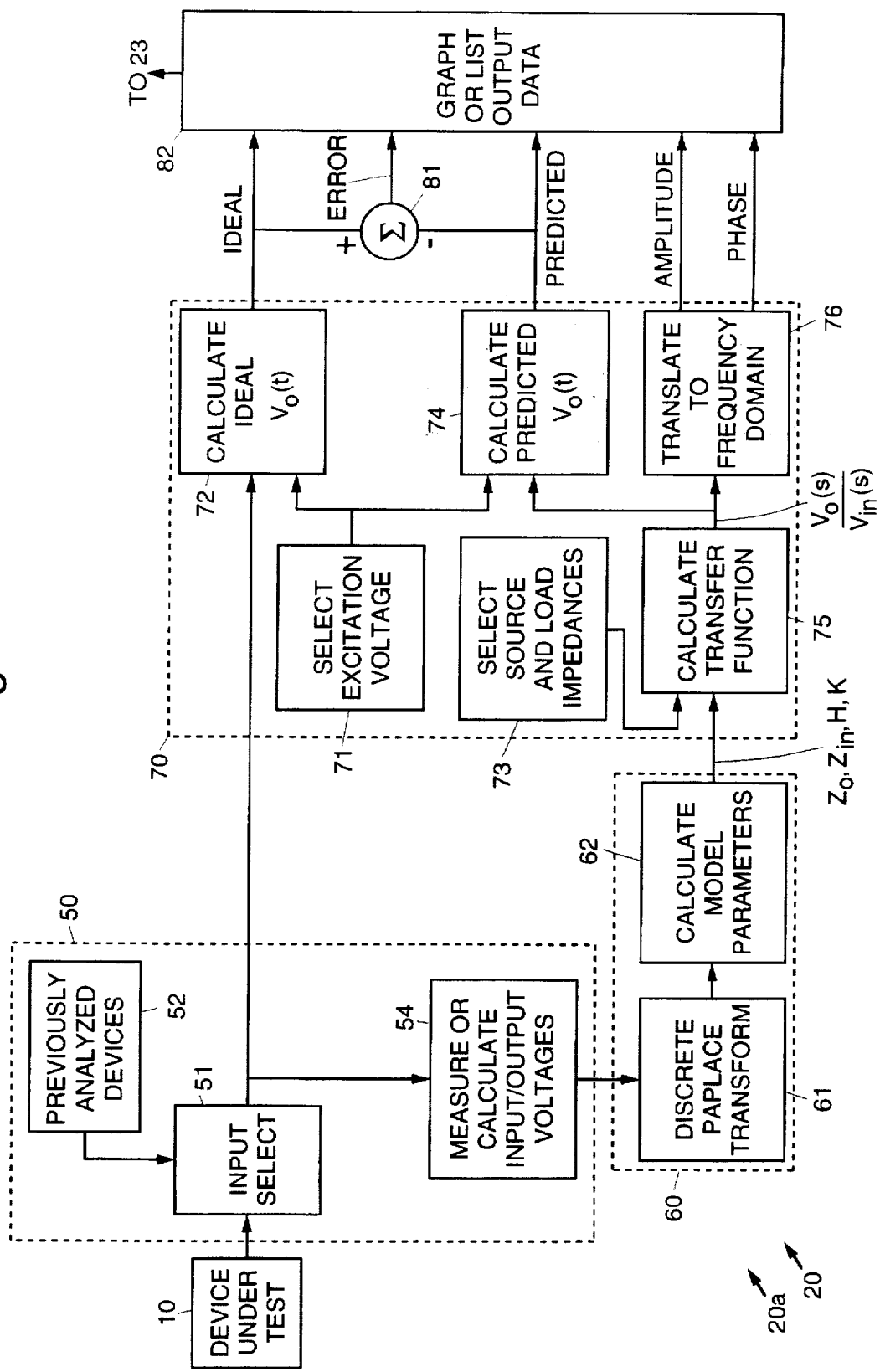
FIG. 4 is a detailed diagram illustrating a time domain processing engine of the present network analyzer.

FIG. 4 is a detailed diagram illustrating a time domain processing engine 20a in accordance with the principles of the present invention that embodies the network analyzer 30 and that is implemented in the high speed processor and controller 20. The essential components of the time domain processing engine 20a implemented in the processor and controller 20 includes data acquisition and emulation means 50, modeling means 60 and prediction means 70. The essence of the time domain processing engine 20a is that it is a computer-implemented software engine or processing method that processes the various waveforms generated while testing the device under test 10 and generates parameters of a network model from the measured waveforms that are used to predict both the frequency and time domain response of the device under test 10. The embodiment of the functional operations shown in FIG. 4 are described in detail below.

The data acquisition and emulation means 50 comprises an input selection circuit 51 that is used to select inputs from the device under test 10 or from stored data 52 derived from previously tested devices 10. The data acquisition and emulation means 50 receives signals from the waveform recorders 31-33 when testing the device under test 10. Based upon these signals, measurement means 52 measures the source, input, and output voltages of the device under test 10. These voltages have been previously identified with reference to FIG. 1 as voltages $V_o(s)_u$, $V_{in}(S)_u$, $V_{source}(S)_u$, $V_{in}(S)_L$, $V_o(S)_L$ and $V_{source}(S)_L$. Based upon the voltage measurements, the measurement means 52 models the network of the device under test 10 from the waveforms of these voltages. If stored waveforms of a previously analyzed device 52 are processed to model the device for different load conditions or input stimuli, then the measurement means 52 models the network of the previously analyzed device 52 using the previously stored waveforms. Thus the data acquisition and emulation means 50 acquires, stores and emulates input and output voltage waveforms of the device 10.

In the case of the device under test 10, the input voltages are acquired by measurement means 52 based upon the duration of the input stimulus specified by the user, the number of samples to be taken during acquisition, the ranges of values in the acquired voltages, the rise time of the input stimulus, and component values of the loads 11, 17.

The modeling means 60 comprises a set of discrete LaPlace transforms 61 and means for calculating model parameters 62 that process the measured or calculated voltage waveforms output from the data acquisition and emulation means 50. The modeling means 60 converts the voltage waveforms computed by the data acquisition and emulation means 50 into discrete LaPlace transforms. The discrete LaPlace transforms 61 are used to calculate the four network parameters described previously. The modeling means 60 calculates the modeling parameters 62 by using the discrete LaPlace transforms 61 of the voltages provided by the transform means 62.

The prediction means 70 predicts how the device under test 10 will respond to any input stimulus with any source voltage and load impedance. The prediction means 70 is comprised of means for selecting an excitation voltage 71 (input stimulus), transfer function calculation means 75, means for selecting input and output impedances 73 that comprise the input and output loads 17, 11 that are input to the transfer function calculation means 75, predicted output voltage calculation means 74, ideal output voltage calculation means 72, and frequency domain translation means 76 for translating time domain data to frequency domain data that is to be displayed to the user.

A summing device 81 is coupled to the predicted and ideal output voltage calculation means 74, 72 that is used to generate an error signal that is displayed to the user. Output data is generated by the time domain processing engine 20a and network analyzer 30 that comprises graphical or lists of data that are displayed to the user. This data allows the user to completely understand the characteristics of the device under test 10 or a selected device that has been previously analyzed.

The following is a description of the operation of the network analyzer 30 and time domain processing engine 20a in the processor and controller 20 shown in FIG. 3 and 4. The operator inputs the values of both the source and load resistors (input and output loads 17, 11) into the processor and controller 20. The operator inputs the duration and rise time of the pulse required to stimulate the device under test 10. The system initializes the pulse generator 18 and sets up the proper pulse duration and rise time. The system initializes the waveform recorders 31-33, establishes the proper sampling frequency, and prepares them for pre-triggering.

The switch (SW) is initially opened thus presenting a no-load condition to the device under test 10. The waveform recorders 31-33 are pre-triggered and the pulse generator 18 is subsequently triggered. The waveform recorders 31-33 buffer the waveforms and transfer them, in tabular form, to the processor 20. The switch (SW) is then closed, thus presenting a load to the device under test 10. The waveform records 31-33 are pre-triggered and the pulse generator 18 is subsequently triggered. The waveform recorders 31-33 buffer the second set of waveforms and transfer them, in tabular form, to the processor 20.

If a particular previously analyzed device 52 is chosen by the user, then its performance under known stimulus is predictable and is representable by six equations. These equations provide the closed form solutions for the voltages in FIG. 2. These voltages are described in equations that have been previously described. The six equations were evaluated based on the following information: the duration of input stimuli as specified by the user; the number of samples to be taken during the stimulation of the network; component values of the device 52 and the loads 11, 17.

The discrete evaluation of these equations provided the raw data for the six input tables used to calculate the network parameters and is equivalent to using waveform recorders to sample the voltages of real networks. Furthermore, the software 20a comprising the time domain network analyzer 30 is configured such that real devices 10 can be modeled by actually measuring their input and output waveforms.

The next step in the process is to convert the six tables of waveform data into discrete LaPlace Transforms. These transforms are used to calculate the four network parameters of the device 52. Furthermore, these parameters act as a fingerprint of the device 52, in that they represent the characteristics of the device 52, and can be used to evaluate whether it is functioning properly or not. The parameters are saved within a mass storage area of the processor and controller 20 and are available for listing or use in network performance predictions.

Given that the device 52 is characterized by the completed model parameters, predictions of how it will respond to any stimulus with any source and load impedance are possible. Prediction of loaded output voltages for a given input stimuli and input impedances were generated.

Furthermore, if a known network is chosen by the user, then the output voltage resulting from a prediction can be compared against the expected or ideal output voltage using the summing device 81. The prediction means 70 (software)

allows the user to chose from a variety of input stimuli. These stimuli include step, exponential, sinusoid, or ramp waveforms.

For known devices 52, the predicted output voltage is compared against the mathematically ideal output. Time domain voltage waveforms and error values may be output in tabular or graphical form. For devices 10 that are of unknown makeup but modeled by the four parameters, output voltage prediction can still be made. The mathematical ideal waveform, however, is unknown and thus error plots do not result.

Another feature of the prediction means 70 is the translation of the LaPlace transfer function (of the device 52) into the frequency domain 76. This translation permits the evaluation of both the gain and phase of the device 52 as function of frequency. The resultant predictions can either be plotted or listed.

There are many applications for the present network analyzer 30. example, a test engineer must know whether a product meets the tolerances and performance criteria as specified by the designer. Network analysis provides a description of the behavior of a linear network both in the frequency domain and in the time domains. This characterizes the performance of the network that is tested. Furthermore, the current trend in testing is shifting from parametric tests to functional tests. Functional tests have the advantages of requiring simpler test stations and taking less time to run a go path test. Network analysis lends itself toward functional testing in that it characterizes the overall units performance of the network rather than measuring individual parameters (i.e., gain, rise time, fall time, and the like).

The present invention is a versatile low frequency network analyzer 30 that has the capability to characterize low frequency networks both in the frequency domain and in the time domain. Some of the typical applications of the present network analyzer 30 are as follows. It may be used to replace complex ground support equipment currently used by the military. The present invention provides a high speed functional test for low frequency analog modules such as servo systems, base band amplifiers, and low frequency filter networks. The present invention may be used with factory test equipment to provide a low cost network analysis capability to reduce its cost. In addition, statistical histograms may be generated to characterize performance tolerances in manufacture.

The present invention may be used for incoming inspection test. The present invention simplifies incoming inspection test; reducing the skill level required for testing, reduce the equipment required for testing. The present invention may be used by design engineering personnel to provide a low cost tool to assist the designer in characterizing network performance. This will reduce design costs by permitting network parameters to be precisely adjusted to meet specified performance objectives. The present invention may be used for education applications to provide a low cost laboratory tool for colleges and technical schools. It may be used both in a research environment and in a classroom environment to demonstrate network performance.

Thus, a time domain network analyzer for deriving parameters of a network model from measured signals that may be used to predict both the frequency and time domain response of a device under test has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. A time domain network analyzer comprising:
   a computer-implemented time domain network analyzer comprising:
   (i) data acquisition and emulator means that acquires, stores and emulates input and output voltage waveforms of the device,
   (ii) modeling means coupled to the data acquisition and emulator means for processing the input and output voltage waveforms to calculate electrical network parameters of the device, and
   (iii) prediction means coupled to the data acquisition and emulator means and modeling means for (a) computing a transfer function of the device using the electrical network parameters and user defined input and output impedance values of the device, and (b) translating data contained in the transfer functions into the frequency domain to provide amplitude and phase data versus time for the device; and
   a display coupled to the prediction means of the computer-implemented time domain network analyzer for displaying (a) voltage versus time data graphs and (b) amplitude and phase versus time data of the device.

2. A time domain network analyzer comprising:
   a computer-implemented time domain network analyzer comprising:
   (i) data acquisition and emulator means that acquires, stores and emulates input and output voltage waveforms of the device,
   (ii) modeling means coupled to the data acquisition and emulator means for processing the input and output voltage waveforms to calculate electrical network parameters of the device, and
   (iii) prediction means coupled to the data acquisition and emulator means and modeling means for (a) computing a transfer function of the device using the electrical network parameters and user defined input and output impedance values of the device and (b) translating data contained in the transfer functions into the frequency domain to provide amplitude and phase data versus time for the device; and
   a display coupled to the prediction means of the computer-implemented time domain network analyzer for displaying (a) voltage versus time data of the device, (b) tabular listings, and (c) amplitude and phase versus time data of the device.

3. A time domain network analyzer comprising:
   a computer-implemented time domain network analyzer comprising:
   (i) data acquisition and emulator means that acquires, stores and emulates input and output voltage waveforms of the device,
   (ii) modeling means coupled to the data acquisition and emulator means for (a) processing the input and output voltage waveforms to calculate electrical network parameters of the device and (b) processing the input and output voltage waveforms using discrete LaPlace transforms, and
   (iii) prediction means coupled to the data acquisition and emulator means and modeling means for computing a transfer function of the device using the electrical network parameters and user defined input and output impedance values of the device; and
   a display coupled to the prediction means of the computer-implemented time domain network analyzer for displaying voltage versus time data of the device.

4. A time domain network analyzer comprising:

a computer-implemented time domain network analyzer comprising:
  (i) data acquisition and emulator means that acquires, stores and emulates input and output voltage waveforms of the device,
  (ii) modeling means coupled to the data acquisition and emulator means for processing the input and output voltage waveforms to calculate electrical network parameters of the device, and
  (iii) prediction means coupled to the data acquisition and emulator means and modeling means for computing a transfer function of the device using the electrical network parameters and user defined input and output impedance values of the device;

a display coupled to the prediction means of the computer-implemented time domain network analyzer for displaying voltage versus time data of the device;

a stimulus generator for providing an input stimulus to the device; and a plurality of waveform recorders coupled to the device for recording input and output waveforms of the device.

5. The network analyzer of claim 4 further comprising:

a switchable and selectable input load coupled to an input of the device for switchably selecting a user-defined input load for the device; and a switchable and selectable output load coupled to an output of the device for switchably selecting a user-defined output load for the device.

6. The network analyzer of claim 5 further comprising synchronization means coupled to the stimulus generator and plurality of waveform recorders for synchronizing recordation of the input and output voltage waveforms.

7. A computer-implemented time domain network analyzer comprising:

data acquisition and emulator means that acquires, stores and emulates input and output voltage waveforms of the device;

modeling means coupled to the data acquisition and emulator means for processing the input and output voltage waveforms to calculate electrical network parameters of the device; and prediction means coupled to the data acquisition and emulator means and modeling means for (a) computing transfer functions for the device using the electrical network parameters and user defined input and output impedance values of the device and (b) translating data contained in the transfer functions into the frequency domain to provide amplitude and phase data versus time for the device.

8. A computer-implemented time domain network analyzer comprising:

data acquisition and emulator means that acquires, stores and emulates input and output voltage waveforms of the device;

modeling means coupled to the data acquisition and emulator means for (a) processing the input and output voltage waveforms to calculate electrical network parameters of the device and (b) processing the input and output voltage waveforms using discrete LaPlace transforms; and prediction means coupled to the data acquisition and emulator means and modeling means for computing transfer functions for the device using the electrical network parameters and user defined input and output impedance values of the device.

* * * * *